(12) United States Patent
Wang et al.

(10) Patent No.: US 8,592,309 B2
(45) Date of Patent: Nov. 26, 2013

(54) LASER SPIKE ANNEALING FOR GAN LEDS

(75) Inventors: Yun Wang, San Jose, CA (US); Andrew M. Hawryluk, Los Altos, CA (US)

(73) Assignee: Ultratech, Inc., San Jose, CA (US)

( * ) Notice: Subject to any disclaimer, the term of this patent is extended or adjusted under 35 U.S.C. 154(b) by 466 days.

(21) Appl. No.: 12/590,360

(22) Filed: Nov. 6, 2009

(65) Prior Publication Data

US 2011/0108796 A1    May 12, 2011

(51) Int. Cl.
   *H01L 21/44*    (2006.01)

(52) U.S. Cl.
   USPC .......... 438/663; 257/13; 257/76; 257/94; 257/E33.025; 438/29; 438/47; 438/507

(58) Field of Classification Search
   USPC .......... 257/13, 99, 184, 76, 94, 101, 103, 257/E33.008, E33.025; 438/37, 507, 29, 438/47, 609
   See application file for complete search history.

(56) References Cited

U.S. PATENT DOCUMENTS

| | | | |
|---|---|---|---|
| 6,200,827 B1 * | 3/2001 | Kimura et al. | .......... 438/46 |
| 6,455,877 B1 | 9/2002 | Ogawa et al. | |
| 6,747,245 B2 | 6/2004 | Talwar et al. | |
| 7,154,066 B2 | 12/2006 | Talwar et al. | |
| 7,259,399 B2 | 8/2007 | Lee et al. | |
| 7,399,945 B2 | 7/2008 | Talwar et al. | |
| 7,436,001 B2 | 10/2008 | Lee et al. | |
| 2003/0178633 A1 * | 9/2003 | Flynn et al. | ............ 257/101 |
| 2008/0173620 A1 * | 7/2008 | Grek et al. | ............ 219/121.8 |
| 2008/0179587 A1 * | 7/2008 | Namkoong et al. | ............ 257/13 |
| 2008/0258174 A1 * | 10/2008 | Seong | ............ 257/184 |

OTHER PUBLICATIONS

Lin et al., "Excimer—laser induced activation of Mg-doped GaN layers," Appl. Phys. Lett vol. 84, No. 14 Apr. 5, 2004 pp. 2515-2517.
Kim et al., "Activation of Mg acceptor in GaN: Mg with pulsed KrF (248 nm) Excimer laser irradiation," Phys. Sol. Stat. (b) 228 No. 2 375-378 (2001) Wiley VCH.
Cheng et al. "Activation of p-TYPE GaN with irradiation of the second harmonics of a Q-switched Nd:YAG laser," Phys. Stat. Sol. (b) 228, No. 2 357-360 (2001) Wiley VCH.
Wang et al., "Effects of laser irradiation on the properties of Mg-doped GaN," SIMTECH tech. rep. vol. 6, No. 3 Oct./Dec. 2005 pp. 6-11.

* cited by examiner

*Primary Examiner* — Mark A Laurenz
(74) *Attorney, Agent, or Firm* — Opticus IP Law PLLC

(57) ABSTRACT

Methods of performing laser spike annealing (LSA) in forming gallium nitride (GaN) light-emitting diodes (LEDs) as well as GaN LEDs formed using LSA are disclosed. An exemplary method includes forming atop a substrate a GaN multilayer structure having a n-GaN layer and a p-GaN layer that sandwich an active layer. The method also includes performing LSA by scanning a laser beam over the p-GaN layer. The method further includes forming a transparent conducting layer atop the GaN multilayer structure, and adding a p-contact to the transparent conducting layer and a n-contact to the n-GaN layer. The resultant GaN LEDs have enhanced output power, lower turn-on voltage and reduced series resistance.

17 Claims, 5 Drawing Sheets

LASER SPIKE ANNEALING FOR GAN LEDS

FIELD OF THE INVENTION

The present invention relates generally to light-emitting diodes (LEDs), and in particular to the use of laser spike annealing in forming GaN LEDs.

BACKGROUND ART

Gallium nitride (GaN) LEDs have proven useful for a variety of lighting applications (e.g., full-color displays, traffic lights, etc.), and have potential for even more applications (e.g., backlighting LCD panels, solid state lighting to replace conventional incandescent lamps and fluorescent lights, etc.) if these LEDs can be made more efficient. To realize higher efficiency for GaN LEDs, they need to have enhanced output power, lower turn-on voltage and reduced series resistance. The series resistance in GaN LEDs is closely related to the efficiency of dopant activation, uniformity of current spreading, and ohmic contact formation.

In GaN, a n-type dopant can be readily achieved using Si and with an activation concentration as high as $1 \times 10^{20}$ cm$^{-3}$. The p-type GaN can be obtained by using Mg as the dopant. The efficiency of Mg doping, however, is quite low due to its high thermal activation energy. At room temperature, only a few percent of the incorporated Mg contributes to the free-hole concentration. Mg doping is further complicated during MOCVD growth because of hydrogen passivation during the growth process. Hydrogen passivation requires a thermal annealing step to break the Mg—H bonds and activate the dopant. Typical thermal annealing is performed at about 700° C. in a N$_2$ environment. To date, the practical hole concentration in p-type GaN is still limited to about $5 \times 10^{17}$ cm$^{-3}$. This low activation level leads to poor ohmic contact and a large spreading resistance, which restrict the performance of GaN LEDs.

SUMMARY OF THE INVENTION

An aspect of the invention is a method of forming a GaN LED. The method includes forming atop a substrate a GaN multilayer structure having a n-GaN layer and a p-GaN layer that sandwich an active layer. The method also includes performing laser spike annealing (LSA) by scanning a laser beam over the p-GaN layer. The method also includes forming a transparent conducting layer atop the GaN multilayer structure. The method further includes adding a p-contact to the transparent conducting layer and a n-contact to the n-GaN layer.

Another aspect of the invention is method of forming a GaN LED. The method includes forming a p-contact layer atop a substrate. The method also includes forming atop the p-contact a GaN multilayer structure having a n-GaN layer and a p-GaN layer that sandwich an active layer, with the p-GaN layer adjacent the p-contact layer. The method also includes forming a n-contact atop the n-GaN layer. The method further includes performing LSA of the n-contact by scanning a laser beam over the n-contact.

Another aspect of the invention is a GaN LED that includes a substrate, and a GaN multilayer structure formed atop the substrate. The GaN multilayer structure has a n-GaN layer and a p-GaN layer that sandwich an active layer. The p-GaN layer has been subjected to LSA to have an activated dopant concentration of greater than about $5 \times 10^{17}$ cm$^{-3}$ and up to about $5 \times 10^{18}$ cm$^{-3}$. The GaN LED includes a transparent conducting layer atop the GaN multilayer structure, a p-contact formed atop the transparent conducting layer, and a n-contact formed atop an exposed portion of the n-GaN layer.

Another aspect of the invention is a GaN LED that includes a substrate and a p-contact layer formed atop the substrate. The GaN LED also includes a GaN multilayer structure formed atop the p-contact layer. The GaN multilayer structure has a n-GaN layer and a p-GaN layer that sandwich an active layer, with the p-GaN layer adjacent the p-contact layer. The n-GaN layer has been subjected to LSA to achieve an active dopant concentration of about $3 \times 10^{19}$ to about $3 \times 10^{20}$ cm$^{-3}$. A n-contact is formed atop the n-GaN layer.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention, and together with the description serve to explain the principles and operations of the invention.

DETAILED DESCRIPTION OF THE INVENTION

Reference is now made in detail to the present preferred embodiments of the invention, examples of which are illustrated in the accompanying drawings. Whenever possible, the same or like reference numbers and symbols are used throughout the drawings to refer to the same or like parts. The terms "above" and "below" are relative terms used to facilitate the description and are not intended as being strictly limiting.

Figure 1:
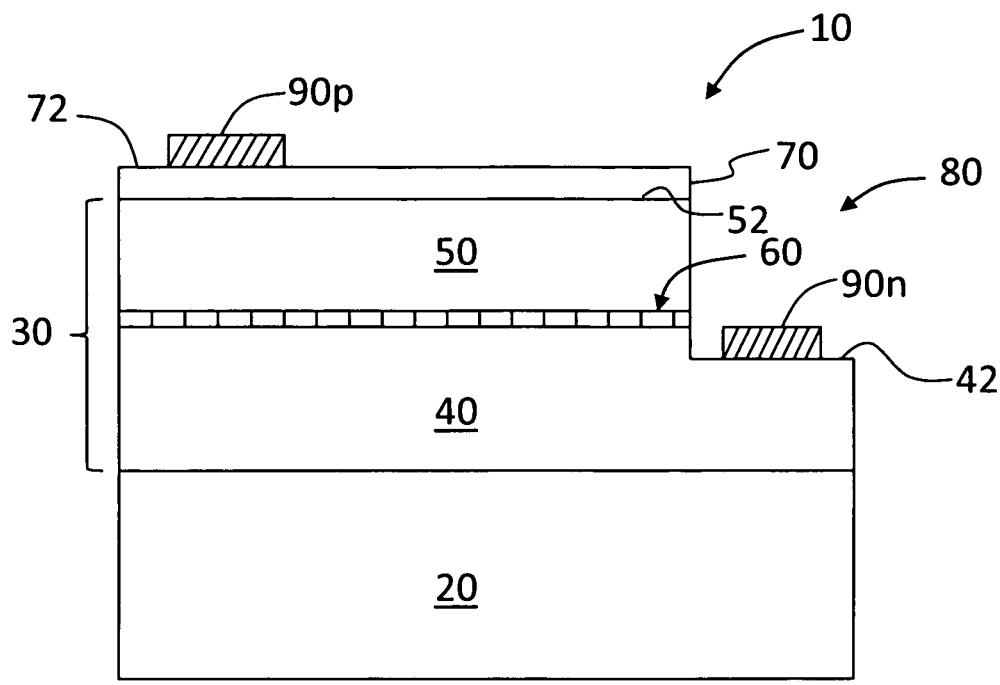
FIG. 1 is a schematic cross-sectional diagram of an example structure for GaN LED.

FIG. 1 is a schematic cross-sectional diagram of an example structure for gallium nitride (GaN) light-emitting diode (LED) 10. Example GaN LEDs are also described in U.S. Pat. Nos. 6,455,877, 7,259,399 and 7,436,001, which patents are incorporated by reference herein. GaN LED 10 includes a substrate 20 such as sapphire, SiC, GaN Si, etc. Disposed atop substrate 20 is a GaN multilayer structure 30 that includes a n-doped GaN layer ("n-GaN layer") 40 and a p-doped GaN layer ("p-GaN layer") 50 with a surface 52. The n-GaN layer 40 and the p-GaN layer 50 sandwich an active layer 60, with n-GaN layer being adjacent substrate 20. Active layer 60 comprises, for example, a multiple quantum well (MQW) structure such as undoped GaInN/GaN superlattices. GaN multilayer structure 30 thus defines a p-n junction. A transparent contact layer (TCL) 70 with a surface 72 resides atop GaN multilayer structure 30. An example TCL 70 includes indium tin oxide (ITO). TCL 70 serves to spread the current and acts as an antireflection coating to optimize optical output.

GaN LED 10 further includes a notch 80 that exposes a surface portion 42 of n-GaN layer 40 that acts as a ledge for supporting a n-contact 90n. Example n-contact materials include Ti/Au, Ni/Au, Ti/Al, or combination thereof. A p-contact 90p is arranged on a portion of TCL surface 72. Example p-contact materials include Ni/Au and Cr/Au.

GaN LED 10 differs from prior art GaN LEDs in at least one of the following ways: a) the dopant activation in p-GaN layer 50 is greater, b) the n-contact 90n is alloyed using laser spike annealing (LSA), and c) the p-contact 90p is alloyed using LSA. The methods of processing GaN LED 10 to achieve these differences is described in detail below.

Laser Spike Annealing (LSA)

To increase the activation in p-GaN layer 50, a high annealing temperature with a short duration is desirable. Using conventional rapid thermal annealing (RTA), the maximum temperature that can be applied is limited by the degradation of the GaN material properties. One degradation mechanism is the decomposition of p-GaN layer 50, which is doped (e.g., with Mg) during an MOCVD growth process. The Mg needs a relatively high annealing temperature for efficient activation, but a long duration at high temperature decomposes GaN by nitrogen out-diffusion and reduces the concentration of free-holes in the p-GaN. Typical RTP type annealing processes hold the substrate at 700° C. in a nitrogen environment for between several tens of seconds to minutes.

Another degradation mechanism is strain relaxation and dislocation generation in p-GaN layer 50. Due to the lattice mismatch, the hetero-epitaxial structure is in a metastable state with built-in strains. Conventional RTA introduces extra strain due to the mismatch in thermal expansion coefficients, and hence accelerates dislocation propagation and multiplication.

The present invention employs laser spike annealing (LSA), which uses higher temperatures and shorter annealing times than conventional thermal annealing such as RTA. Example LSA systems suitable for carrying out the methods of the present invention are described in U.S. Pat. Nos. 6,747,245, 7,154,066 and 7,399,054, which patents are incorporated by reference herein. Example applications of LSA in the methods of the present invention reduce the annealing time by three to four orders of magnitude as compared to conventional RTA, enabling higher annealing temperatures $T_A$ (e.g., $T_A > 1,100°$ C.) without the detrimental nitrogen-out diffusion and dislocation generation effects.

Enhancing the dopant activation in the doped GaN layer using LSA improves the contact resistance because the tunneling current is higher and the barrier heights are lower at high dopant concentrations. At high active dopant concentration, the specific contact resistance $\rho_c$ scales as:

$$\rho_c \propto \exp\left[\frac{4\pi\sqrt{\varepsilon m^*}}{h} \frac{\phi_B - \Delta\phi_B}{\sqrt{N}}\right] \quad \text{Equation 1}$$

where the barrier height change $\Delta\phi_B$ is given by:

$$\Delta\phi_B = \left[\frac{q^3 N}{8\pi^2 \varepsilon^3}\left(V_0 - \frac{k_B T}{q}\right)\right]^{\frac{1}{4}} \quad \text{Equation 2}$$

In the above equations, h is the Planck constant, m* is the effective mass of electron or hole, $\varepsilon$ is the dielectric constant of the nitride, N is the active dopant concentration, q is the elementary charge, $k_B$ is the Boltzmann constant, T is the absolute temperature, and $V_0$ is the contact potential.

Increasing the active dopant concentration N increases $\Delta\phi_B$, which reduces the numerator in the exponent of equation 1, and increasing N decreases $\rho_c$ by increasing the denominator in the exponent of equation 1. As a result, the contact resistance $\rho_c$ decreases with increasing dopant activation. Example embodiments the methods of the present invention increase the activated dopant concentration in p-GaN by a factor of up to about 2.5× (e.g., from about $5 \times 10^{17}$ cm$^{-3}$ to about $1.25 \times 10^{18}$ cm$^{-3}$), thereby providing a reduction in total contact resistance (including spreading resistance) of about 60%.

Figure 2:
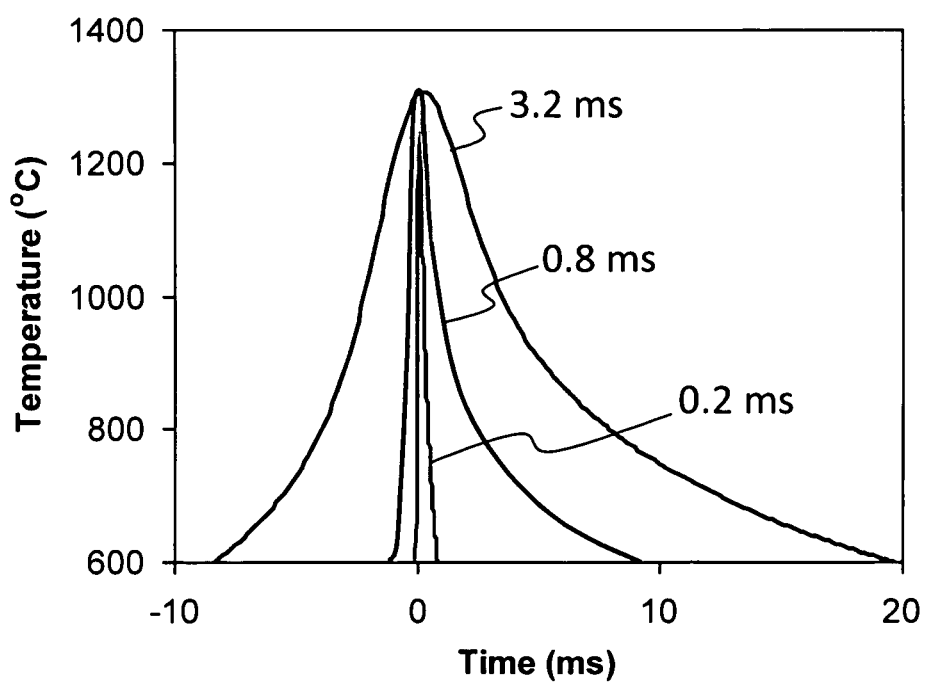
FIG. 2 is a plot of the annealing temperature $T_A$ (° C.) vs. time (milliseconds, ms) and illustrates example annealing temperature profiles for three different dwell times of a scanned laser beam when performing laser spike annealing (LSA)
Figure 3:
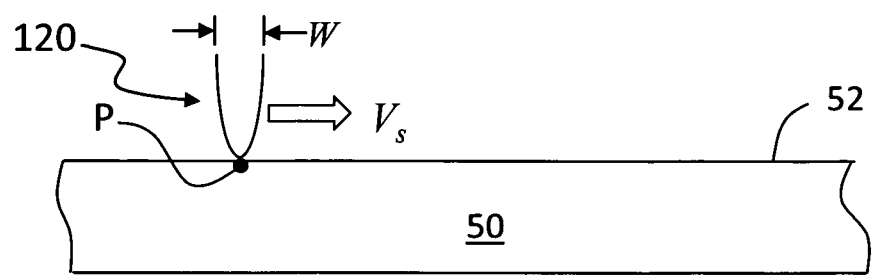
FIG. 3 is a close-up side view of a p-GaN layer illustrating the LSA process using a scanned laser beam.
Figure 4:
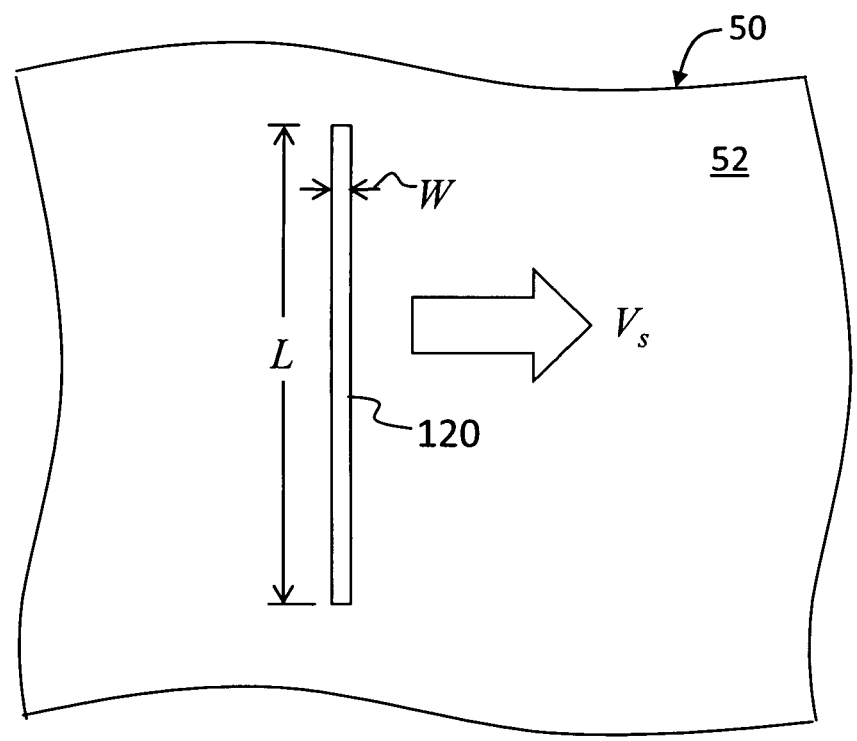
FIG. 4 is a schematic view of an example line-type scanned laser beam shape.

FIG. 2 is a plot of the annealing temperature $T_A$ (° C.) vs. time (ms) and illustrates example annealing temperature profiles (curves) for three different dwell times of a scanned laser beam 120 such as shown in FIG. 3 and FIG. 4. The curves in FIG. 2 represent the annealing temperature profile of a point P on a surface of a given layer, such as surface 52 of p-GaN layer 50, as shown, as laser beam 120 approaches and passes over the point. In the calculation, laser beam 120 has a long and thin shape (as taken at a select intensity threshold) at surface 52, e.g., has a length L of about 10 mm and a width W of about 100 μm, or an aspect ratio of about 100:1. Laser beam 120 scans across surface 52 at a velocity $V_S$. The dwell time $t_d$ is determined by the beam width W and the scan velocity $V_S$. For longer dwell times, thermal conduction preheats the point P as the laser beam 120 approaches, until the laser beam strikes the point, thereby bringing the anneal temperature up to its maximum value $T_{AM}$. For shorter dwell times, the thermal conduction is insufficient to pre-heat the silicon and point P experiences the maximum annealing temperature $T_{AM}$ for a much shorter duration. This allows for adjusting the annealing temperature profile.

Example LSA Methods for GaN LED Structures

Figure 5:
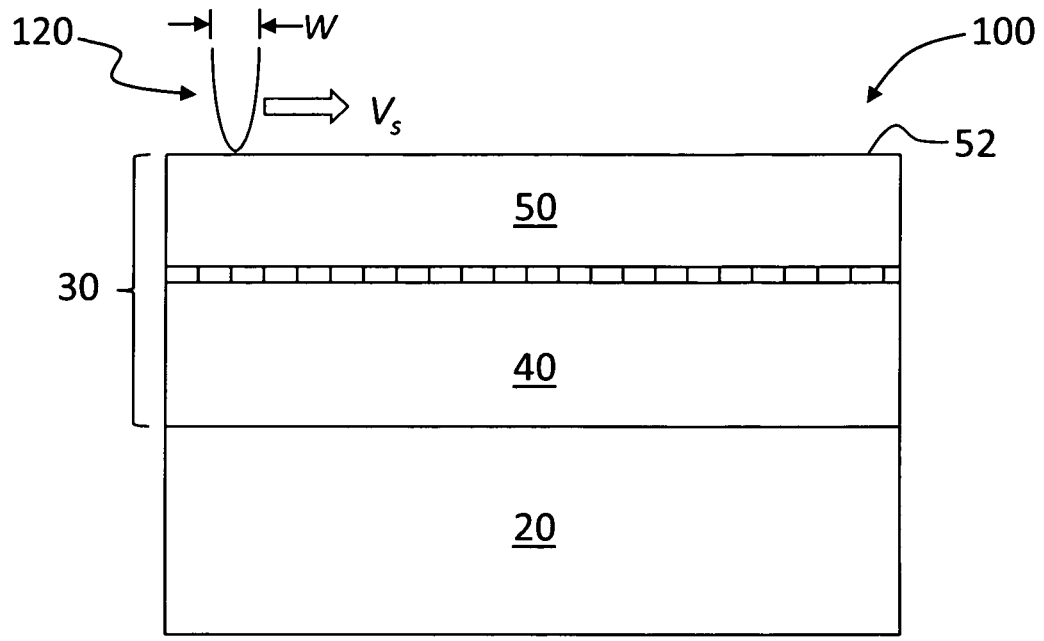
FIG. 5 is a schematic diagram of a first example LSA method as applied to a GaN LED structure formed in the process of creating the GaN LED of the present invention such as shown in FIG. 1.

FIG. 5 is a schematic diagram of a first example LSA method as applied to a GaN LED structure 100 formed in the process of creating GaN LED 10. GaN LED structure 100 includes substrate 20 and GaN multilayer structure 30. Scanning laser beam 120 is made incident upon surface 52 of p-GaN layer 50. Scanning of laser beam 120 is achieved by either scanning the laser beam or by scanning GaN LED structure 100, e.g., by scanning the wafer (not shown) used in the process of forming GaN LEDs 10. An example range for the dwell time $t_d = W/V_s$ is from about 10 microseconds (μs) to 10 milliseconds (ms). An example range for the maximum anneal temperature $T_{AM}$ is from about 900° C. to about 1,500° C. The maximum anneal temperature $T_{AM}$ is determined by the amount of GaN disassociation and the lattice mismatch strain relaxation and dislocation in GaN LED structure 100. The depth of the annealing depends on the dwell time and the laser beam intensity. An example laser beam intensity is 400 W/mm². Example GaN multilayer structure 30 has a thickness of a few to about 10 μm, and the anneal typically reaches from 10 μm to 100 μm, i.e., generally through the GaN multilayer structure and in some cases all the way down to substrate 20. Thus, even though increased dopant activation of p-GaN layer 50 is being pursued, in an example embodiment there is the additional benefit of increasing the dopant activation in the underlying n-GaN layer 40.

Once the annealing of GaN LED structure 100 is performed, then TCL 70 is applied atop p-GaN layer surface 52. Notch 80 is then formed, and n-contact 90*n* and p-contact 90*p* are applied (e.g., deposited) to form GaN LED 10 as shown in FIG. 1

Figure 6:
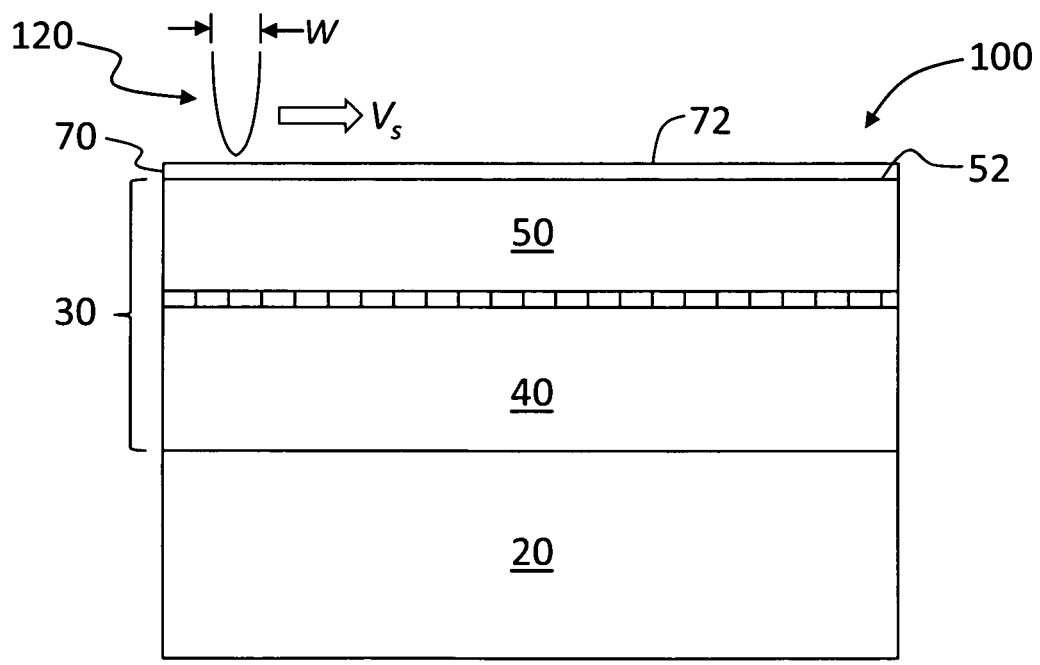
FIG. 6 is similar to FIG. 5 and shows the GaN LED multilayer structure as further including a transparent conducting layer.

FIG. 6 is similar to FIG. 5 and shows GaN LED structure 100 as further including TCL 70. An advantage of performing LSA after deposition of TCL 70 is that the TCL can serve as a capping layer to prevent nitrogen from outgassing during annealing, thereby enabling higher annealing temperatures $T_A$ without material degradation.

Figure 7:
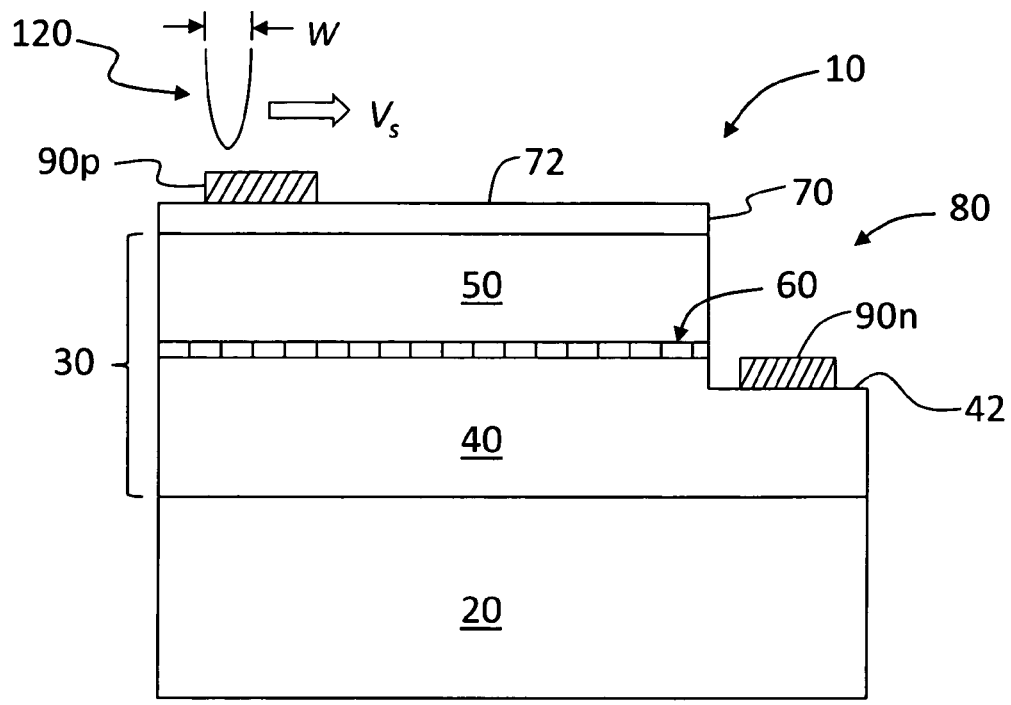
FIG. 7 is similar to FIG. 1 and shows the GaN LED being subjected to LSA via the scanning of a laser beam over the transparent conducting layer surface as well as over the p-contact formed thereon.

FIG. 7 is similar to FIG. 1 and shows GaN LED 10 being subjected to LSA via the scanning of laser beam 120 over TCL surface 72, including over p-contact 90*p*. The relatively low thermal budget of LSA as compared to conventional annealing techniques such as RTA allows for the aforementioned high annealing temperatures to be used without the risk of the metal in p-contact 90*p* spiking through the p-n junction.

In an example embodiment of the annealing methods disclosed herein, LSA is used for ohmic alloy formation in p-contact 90*p* in the GaN LED of FIG. 7. Typically, p-type ohmic contact is achieved by alloying Ni/Au at temperatures between 500° C. and 800° C. for 10 to 20 minutes. High alloying temperatures cause morphology degradation and leakage due to over-diffusion of alloying metal through the p-n junction. Because of low p-type concentrations, the contact resistance is high, e.g., about $1 \times 10^{-3}$ ohm-cm². This not only causes a large voltage drop but also generates local heating that could degrade the lifetime of the GaN LED at high current levels. By using LSA, higher annealing temperatures can be applied without agglomeration. This provides a new opportunity for forming p-contacts 90*p* and improving the overall reliability of GaN LED 10. In an example embodiment, the p-contact contact resistance is in the range from about $4 \times 10^{-4}$ to about $1 \times 10^{-5}$ ohm-cm². Thus, in an example embodiment of the method of the present invention, the combination of p-contact alloying and increase dopant activation in p-GaN layer 50 provides a combined benefit that provides an additional increase in the performance of the resultant GaN LED 10.

Figure 8:
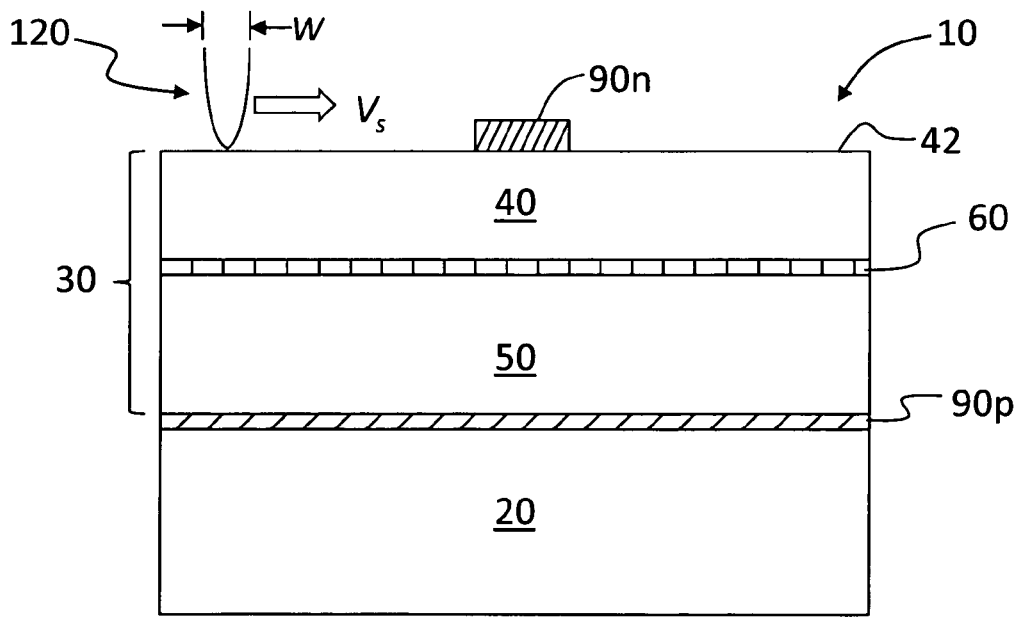
FIG. 8 is similar to FIG. 5 and shows an example GaN LED where the GaN LED multilayer structure is reversed so that the n-GaN layer is on top and includes a n-contact, with the GaN LED being subjected to LSA via the scanning of a laser beam over the surface of n-GaN layer.

FIG. 8 is similar to FIG. 5 and shows an example vertical GaN LED 10, wherein substrate 20 is metal (e.g., a copper alloy), and GaN multilayer structure 30 has the n-GaN layer 40 and p-GaN layer 50 reversed from that shown in FIG. 5, i.e., the n-GaN layer 40 with a surface 42 is above active layer 60 and the p-GaN layer 50 is below the active layer. A n-contact 90*n* resides atop n-GaN layer surface 42 and a p-contact 90*p* resides below p-GaN layer and also serves as a reflective layer. A separate reflective layer (not shown) may also be added adjacent the p-contact 90*p*. GaN LED 10 of FIG. 8 is subjected to LSA via the scanning of laser beam 120 over n-GaN layer surface 42, including over n-contact 90*n*. Metal substrate 20 is bonded to GaN multilayer structure 30 and has good thermal conductivity that serves to efficiently dissipate heat. Note again that because the annealing reaches down to the p-GaN level, in an example embodiment this layer also experiences an increased dopant activation that further enhances the performance of the resultant GaN LED 10.

Establishing ohmic contact of n-contact 90*n* to n-GaN layer 40 is usually not a problem due to the generally high dopant concentration in this layer. Specific contact resistance $\rho_c$ below $1 \times 10^{-6}$ ohm-cm² can be achieved. However, in advanced flip chip LEDs, n-contact formation is performed after bonding to a different substrate. In this case, the thermal budget (defined as the product of the thermal activation $\exp\{-E_a/k_B T_A\}$ and the annealing duration, where $E_a$ is the thermal activation energy, $k_B$ is the Boltzmann constant, and $T_A$ is the annealing temperature) needs to be limited to avoid stress and dislocation generation from the mismatch of thermal expansion coefficient between GaN multilayer structure 30 and (metal) substrate 20. In this case, low temperature RTA at 300° C. has been used to form ohmic contacts and resulted in a contact resistance $\rho_c = 7 \times 10^{-4}$ ohm-cm², which is much higher than what is achievable using the higher annealing temperatures and ultra-low thermal budgets associated with LSA. In an example embodiment, a contact resistance $\rho_c$ as low as $1 \times 10^{-6}$ ohm-cm² is achieved in n-GaN using LSA annealing, leading to improved GaN LED performance of up to 8% at 350 mA drive current as compared to LED without laser annealing.

Reducing the contact resistance of the GaN LED leads to improved performance. As diode currents increase, the intrinsic resistance given by $(nk_B T/qI)$ (where n is the ideality factor, $k_B$ is the Boltzmann constant, T is the junction temperature, q is the elementary charge, and I is the diode current) decreases to the point that the series resistance $R_S$ dominates the efficiency of the GaN LED.

Figure 9:
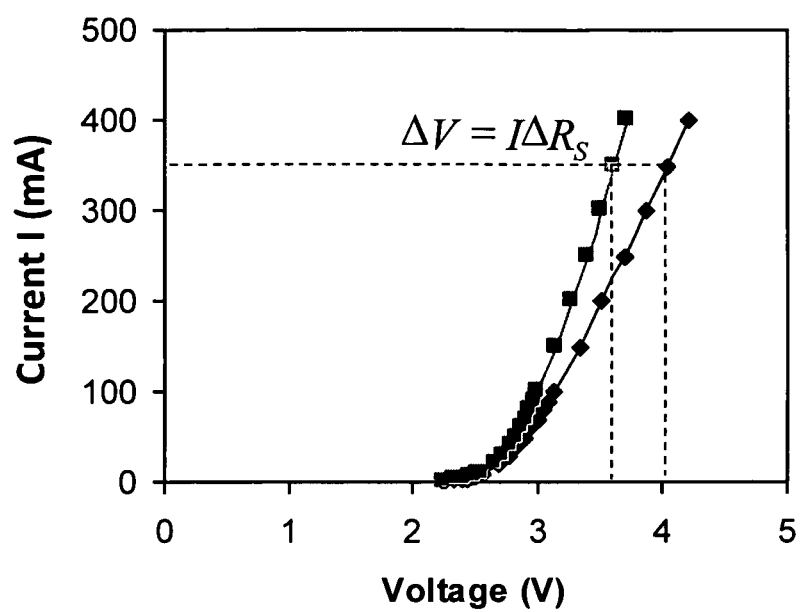
FIG. 9 is plots modeled current (milliamperes, ma) vs. voltage (V) curves that illustrate the performance gains of the GaN LED of the present invention (■) as compared to the prior art performance (♦) as achieved using LSA to lower the series resistance on the operating voltage.

FIG. 9 plots modeled current I (milliamperes, mA) vs. voltage (V) curves that illustrate the performance gains of GaN LED 10 by using LSA to lower the series resistance on the operating voltage. The plots are for GaN LEDs having different series resistances $R_S$, with the "diamonds" curve (♦) modeling conventional GaN LEDs and the "squares" (■) curve modeling a GaN LED with 2.5× higher dopant activation in p-GaN using the LSA-based methods of the present invention. Note that the voltage change ΔV is related to the change in the series resistance via the relationship $\Delta V = I \Delta R_S$ At a current I=350 mA, a 40% reduction in series resistance Rs (60% drop in contact resistance) results in about 10% drop in operation voltage V and hence a 10% increase in LED efficiency in terms of lumens/watt. A major part of the series resistance is due to the contact resistance.

The improvements can be even greater for higher drive currents anticipated being employed by major LED manufacturers in the future. The two curves in FIG. 9 diverge so that at higher driver currents, the voltage drop is larger. Thus, at a drive current of 700 mA, the GaN LED formed using the methods of the present invention is anticipated to be 15-20% more efficient than a conventionally doped GaN LED. This improves a GaN LED having a conventional output of 100-lumens/watt GaN LED to have an output of about 120 lumens/watt.

It will be apparent to those skilled in the art that various modifications and variations can be made to the present invention without departing from the spirit and scope of the invention. Thus it is intended that the present invention cover the modifications and variations of this invention provided they come within the scope of the appended claims and their equivalents.

What is claimed is:

1. A method of forming a gallium nitride (GaN) light-emitting diode (LED), comprising:
   forming atop a substrate a GaN multilayer structure having a n-GaN layer and a p-GaN layer that sandwich an active layer, wherein the p-GaN layer includes dopants bound to hydrogen;
   performing laser spike annealing (LSA) through at least the p-GaN layer by scanning a laser beam over the p-GaN layer, thereby breaking the hydrogen bonds and activating the dopants therein;
   forming a transparent conducting layer atop the GaN multilayer structure; and
   adding a p-contact to the transparent conducting layer and a n-contact to the n-GaN layer.

2. The method of claim 1, further comprising performing the LSA through the transparent conducting layer.

3. The method of claim 2, further comprising performing LSA of the p-contact.

4. The method of claim 3, further comprising performing LSA of the n-contact.

5. The method of claim 3, wherein the p-contact has a p-contact resistance, and said performing of LSA of the p-contact results in the p-contact resistance being in a range from about $4\times10^{-4}$ ohm-cm$^2$ to about $1\times10^{-5}$ ohm-cm$^2$.

6. The method of claim 4, further comprising:
   forming a ledge in the GaN multilayer structure and transparent conducting layer to expose the n-GaN layer; and
   forming the n-contact on the exposed GaN layer.

7. The method of claim 1, wherein the LSA has a maximum anneal temperature $T_{AM}$ in the range from about 900° C. to about 1,500° C.

8. The method of claim 7, wherein the scanning of the laser beam is conducted so that the laser beam has a dwell time from about 10 μs to about 10 ms.

9. The method of claim 7, wherein the laser beam has a line-type beam shape with an aspect ratio of about 100:1.

10. The method of claim 1, wherein the p-GaN layer has an activated dopant concentration after LSA in the range from about $5\times10^{17}$ cm$^{-3}$ to about $5\times10^{18}$ cm$^{-3}$.

11. The method of claim 1, further comprising forming the active layer to comprise a multiple quantum well structure.

12. The method of claim 1, wherein the dopants consist of Mg.

13. The method of claim 1, wherein the transparent contact layer includes indium tin oxide (ITO).

14. The method of claim 1, wherein the n-contact includes at least one of Ti/Au, Ni/Au or Ti/Al.

15. The method of claim 1, wherein the p-contact includes at least one of Ni/Au and Cr/Au.

16. The method of claim 1, wherein the p-GaN layer has a contact resistance, and wherein the total contact resistance is reduced by about 60% by performing said laser spike annealing.

17. The method of claim 1, wherein the laser spike annealing reaches through the GaN multilayer structure.

* * * * *